(12) United States Patent
McPartland

(10) Patent No.: US 6,195,295 B1
(45) Date of Patent: Feb. 27, 2001

(54) SEGMENTED COLUMN MEMORY DEVICE VOLTAGE STEERING TECHNIQUE

(75) Inventor: Richard J. McPartland, Nazareth, PA (US)

(73) Assignee: Lucent Technologies, Inc., Murray Hill, NJ (US)

(*) Notice: Subject to any disclaimer, the term of this patent is extended or adjusted under 35 U.S.C. 154(b) by 0 days.

(21) Appl. No.: 09/318,895

(22) Filed: May 26, 1999

Related U.S. Application Data (63) Continuation-in-part of application No. 09/247,302, filed on Feb. 9, 1999.

(51) Int. Cl.$^7$ .................................................. G11C 13/00
(52) U.S. Cl. ................................ 365/189.05; 365/185.33
(58) Field of Search ........................ 365/185.33, 185.29, 365/203, 189.05, 230.08, 226

(56) References Cited

U.S. PATENT DOCUMENTS 5,058,063 * 10/1991 Wada et al. ..................... 365/189.11
6,104,637 * 8/2000 Seo .................................. 365/185.24

* cited by examiner

*Primary Examiner*—Terrell W. Fears
(74) *Attorney, Agent, or Firm*—Synnestvedt & Lechner LLP (57) ABSTRACT

A method and associated circuitry are disclosed for applying the high column segment voltages needed to erase and program (write) a segmented column flash EEPROM memory. Low voltage CMOS transistors are used for both the read column precharge path and the write/erase data transfer path. Also, the column segment select switch can be constructed of a single, low voltage, n-channel, transistor, rather than two complementary high voltage transistors. All of the above reduces precharge and discharge time, increasing the read speed of the memory. This also eliminates the lengthening of precharge time that occurs as the characteristics of high voltage transistors degrade with age. The present invention provides the additional advantage of eliminating the need to use less reliable high voltage transistors in certain off-pitch circuits needed for write and erase functions, thus increasing overall chip reliability.

39 Claims, 5 Drawing Sheets

SEGMENTED COLUMN MEMORY DEVICE VOLTAGE STEERING TECHNIQUE

RELATED APPLICATION

This application is a continuation in part of U.S. patent application Ser. No. 09/247,302, filed Feb. 9, 1999, which is assigned to the same assignee as the present application and is incorporated herein by reference.

FIELD OF THE INVENTION

The present invention relates to electronically programmable memories and particularly flash EEPROM memories.

BACKGROUND OF THE INVENTION

As used herein, the term "high voltage" refers to voltages of nominally more than 5 volts; the term "low voltage" refers to voltages of 5 volts or less, being typically 3.3 volts or less. The term "high voltage transistor" refers to a transistor designed to operate with a minimum of degradation at a high voltage (e.g., a thick-oxide transistor); and the term "low voltage transistor" refers to a transistor designed to operate only at a low voltage (e.g., a low-voltage CMOS transistor).

The use of embedded flash EEPROM (Electronically Erasable Programmable Read Only Memory) in cellular phones, answering machines, cordless phones and other devices containing silicon integrated circuits is increasing. Current generation flash EEPROMs require the use of circuitry and thick-oxide transistors capable of handling high voltages (e.g., typically 7 volts) in the critical read column precharge path for erasing and programming (writing) the flash memory cells because the columns must be raised to high voltages during erase and programming operations (hereinafter referred to collectively as "high voltage memory operations"). However, the use of high voltage transistors in EEPROMs has negative effects on performance. For instance, high voltage transistors operated at high voltages are subject to parameter degradation and are inherently less reliable than low voltage core CMOS transistors operated at lower voltages (e.g., less than 5 volts, typically about 3 volts). Read precharge and cycle times also are increased when high voltage transistors are used in the critical read column precharge path because of their significantly lower gain (typically less than one-half the gain of low voltage core CMOS transistors).

Figure 1:
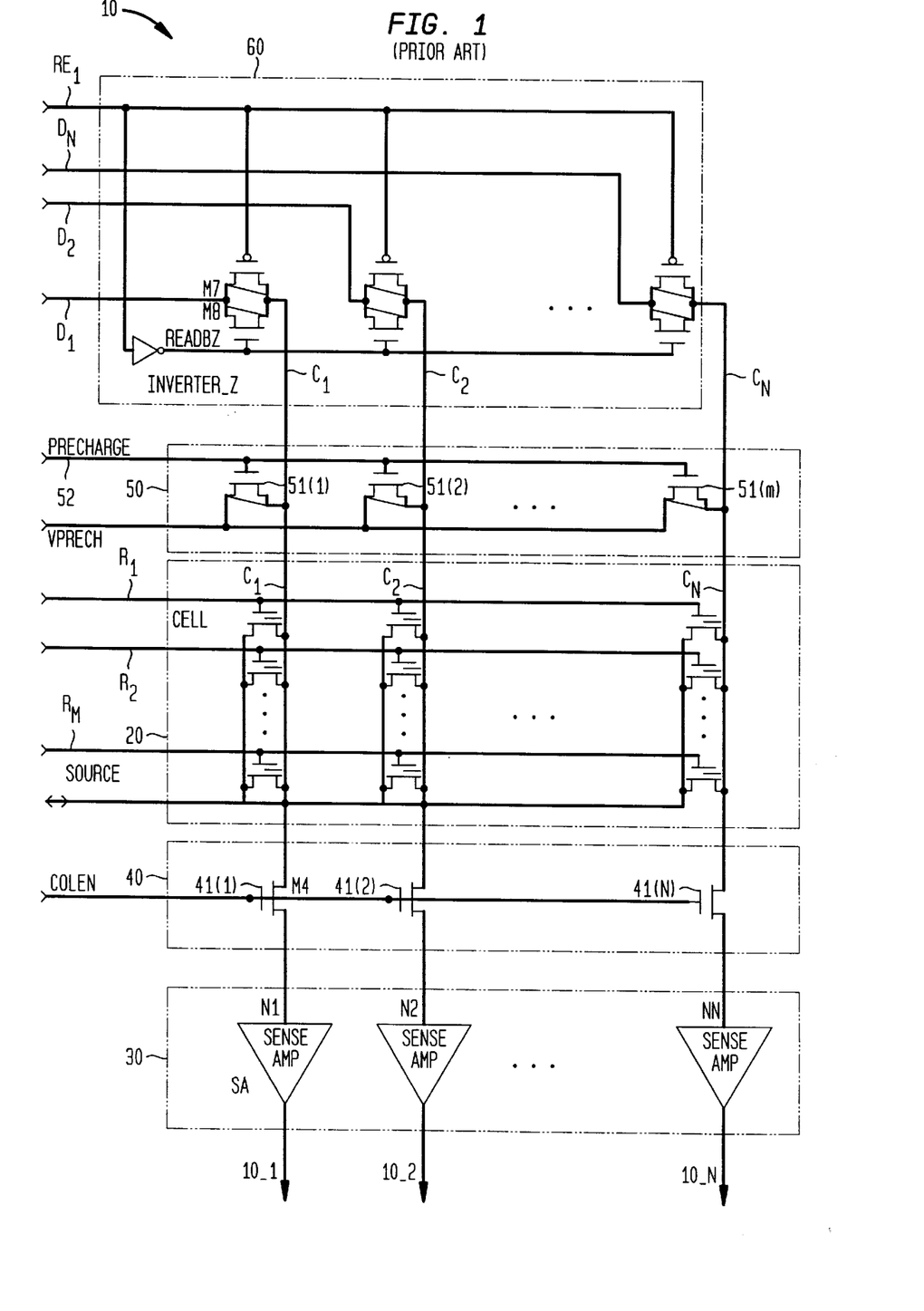
FIG. 1 is a circuit diagram of a flash EEPROM of the prior art.

FIG. 1 illustrates a typical EEPROM circuit 10 of the prior art. FIG. 1 shows a flash EEPROM memory array 20 having N columns ($C_1, C_2, \ldots C_N$) and M rows ($R_1, R_2, \ldots R_M$), an associated on-pitch sense amplifier block 30, column select transistor block 40, high voltage column precharge transistor block 50, and write/erase data transfer gate block 60.

Each memory cell in memory array 20 comprises a floating gate transistor in which the drain terminal is coupled to the associated column, the gate terminal is coupled to the associated row, and the source terminal is coupled to a source. In essence, a floating gate transistor comprises a first gate, the floating gate, positioned above the current channel of the transistor and separated therefrom by a layer of insulation (e.g., oxide) and a second gate, the fixed gate, positioned above the first gate and separated therefrom by another layer of insulation. The fixed gate is directly coupled to the gate terminal of the transistor. Both stacked gate and split gate designs are known in the art.

The column precharge transistor block 50 comprises a thick oxide, high voltage transistors 51(1), 51(2), ... 51(N) coupled to each column, respectively.

As is known in the art, in order to read a flash memory cell, the column associated with that cell must be precharged to a specific voltage, e.g., 1 volt. If that cell has been written to, that is, if it stores a logic 1, then the transistor comprising that cell will remain off when the corresponding row is asserted and will not discharge the voltage that was placed on the column through the precharge transistor. If, on the other hand, the memory cell is erased, that is, if it stores a digital 0, then that cell will be turned on when the corresponding row is asserted, thus driving the column to ground through the source-drain path of the memory cell transistor.

The sense amplifiers 30(1),30(2), . . . 30(m) amplify the column voltage as set by the cell on that column that is being read to produce an output.

As is known in the art, when erasing a flash EEPROM memory array, the columns (drain terminals of the memory cells) are raised to a high voltage, typically 7 volts, while the rows (gate terminals), $R_1, R_2, \ldots, R_M$, are kept at ground (0 volts) or reduced to a negative potential below ground. The source is commonly open circuited for erasing. The high gate to drain voltage differential causes electron tunneling from the drain of the transistor to the floating gate, raising the nominal potential of the floating gate. Enough electron tunneling is allowed to occur to raise the nominal potential of the floating gate to a point at which it will rise above the transistor's threshold current when the corresponding row is asserted (i.e., when the fixed gate is raised to a logic high level, such as 3.3 volts). This will cause the transistor to conduct when the corresponding row is asserted (for reading that cell), thus driving the corresponding column to ground.

When writing a flash EEPROM memory array 20, columns (gates) associated with cells to be written (i.e., that are to store a digital 1) are raised to a high potential, typically 7 volts, as are the rows (drains) associated with the cells to be written. The source terminals are grounded. Other columns associated with cells along the same row that are not being written remain at ground. This condition causes hot electron injection from the current channel to the floating gate, thus lowering the nominal potential of the floating gate. Enough electron injection is allowed to occur to lower the nominal potential of the floating gate to a point at which, even when the gate terminal is raised to 3 volts, i.e., when the corresponding row is asserted, the floating gate will still be below the threshold voltage such that the transistor will not conduct. Accordingly, the column will not be discharged and the cell will be read as logic 1.

It can, therefore, be seen that, when erasing or writing a cell, it is necessary to raise the associated column to a high voltage level. Accordingly, the column precharge transistors, having their drain terminal coupled to the columns, must be high-voltage, thick oxide, transistors in order to handle the high voltage. During erase and write operations, the gates of precharge transistors 51(1), 51(2), . . . 51(N) are at ground (0 volts) along PRECHARGE input 52. This results in a high gate-to-drain potential (e.g., 7 volts) for each transistor, which is easily withstood by the high voltage transistors, but which would destroy low voltage core CMOS transistors.

With reference to the first column $C_1$ in FIG. 1, the method and circuitry of the prior art will be described. For erase and write operations, prior to applying high voltage to inputs $D_1$ and $RC_1$, the precharge input 52 must be set to ground to prevent conduction through the precharge transistor 51(1) within precharge block 50. Also, in preparation for applying high voltage to the first column $C_1$ for writing/ erasing, a high voltage, typically 7 volts, is applied to the data input $D_1$ and the read control input $RC_1$ of the write/ erase data transfer gate block 60. This sets up the data, but blocks conduction through devices M7 and M8.

If the entire memory is being erased, all data input terminals $D_1, \ldots D_n$ receive the high voltage. For programming, however, only the column containing the cell or cells being programmed are charged.

Then, the write or erase is initiated by lowering the read control input $RC_1$, thus allowing the high voltage applied to data input $D_1$ to be transferred onto column C1. Specifically, lowering the read control input $RC_1$, turns on devices M7 and M8, passing the high voltage from data input $D_1$ onto the column.

If the operation is a write, then, for those columns associated with cells not to be written, but along the same row as other cells being written, their voltage is kept at ground by keeping their data inputs (i.e., $D_1, D_2, \ldots D_N$) at ground.

The column select transistor block 40 and sense amplifier block 30 are used for reading the flash memory. Particularly, the column enable signal coupled to the gates of the transistors 41(1), 41(2), ... 41(N) is asserted, thus turning those transistors on so that the column voltage can be sensed by the sense amplifier block 30. The sense amplifiers 30(1), 30(2), ... 30(N) amplify the column voltage to the logic high level for the circuit (e.g., 3.3 volts and hereinafter termed "VDD" ), if the column is at 1 volt. If the column is grounded through a memory cell transistor, then the output of the sense amplifier also is at ground.

Care must be taken not to over-voltage stress the transistors 41(1), 41(2), ... 41(N) during writing or erasing. If column select transistors 41(1), 41(2) ... 41(N) in column select block 40 are low voltage transistors, their gates (COLEN input 42) must be set to VDD level (e.g. 3.3 volts) prior to raising the column voltage above VDD. Otherwise the gate-to-drain voltage will go to a high voltage and possibly damage the transistor's gate oxide. With their gates at VDD and the columns raised high, the inputs to the sense amplifiers(s) $(N_1, N_2, \ldots, N_n)$ will be VDD-Vt. This will not over-stress any transistors in the sense amplifier. Alternatively, the column select transistors 41(1), 41(2) ... 41(N) in the column select transistor block 40 could be high voltage transistors. In this case COLEN input 42 can be set at ground, blocking conduction through these devices.

The precharge transistors, 51(1), 51(2), ... 51(N), are high voltage, thick oxide, transistors in order to handle the high level write and erase voltages. High voltage transistors have low gain because of the thick oxide. Use of these low gain transistors in the precharge block 50 limits circuit performance by increasing precharge and cycle times. The characteristics of high voltage transistors also degrade over time when operated at high voltages. This degradation may, over time, further lengthen precharge time.

Since the write/erase data inputs $D_1, D_2, \ldots D_N$ and the read control signal input $RC_1$ of write/erase data transfer gate block 60 must be at high voltage levels when asserted to carry out the write and erase functions, not only are the transistors in the write/erase data transfer gate block 60 (e.g., transistors $M_7$ and $M_8$) high voltage, thick oxide, transistors, but the off-pitch circuitry (not shown) needed to generate the high voltage signals on lines $D_1, D_2, \ldots D_N$ must also include high voltage transistors.

Because high voltage transistors are generally less reliable than low voltage transistors, the use of so many high voltage transistors also may lead to less reliable EEPROM operation.

In addition, there is a significant amount of capacitance associated with each column. Particularly, each memory cell has an associated capacitance. The greater the capacitance on a column, the slower the column will precharge and discharge for read operations.

Figure 2:
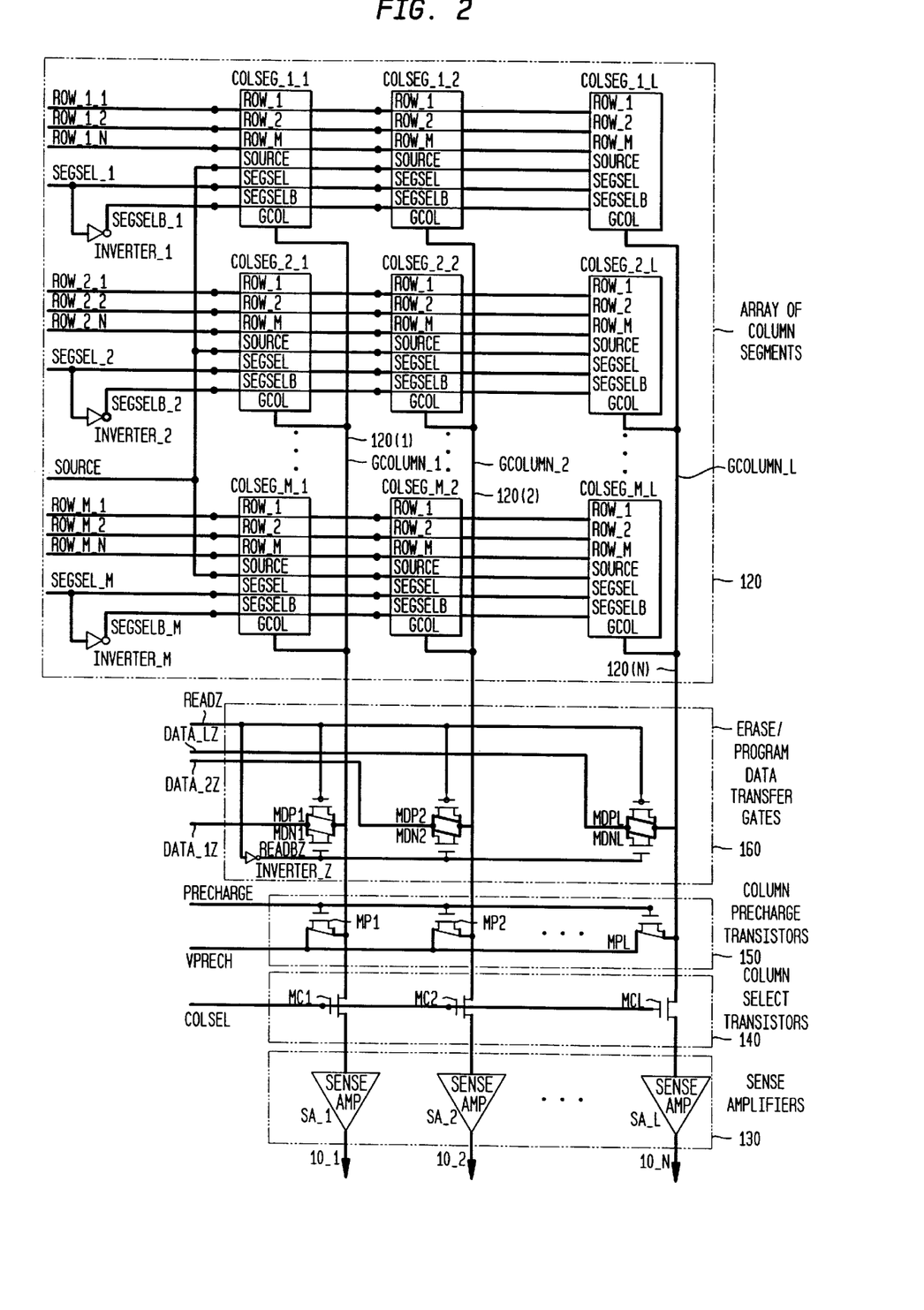
FIG. 2 is a circuit diagram of a flash EEPROM having segmented columns of the prior art.
Figure 3:
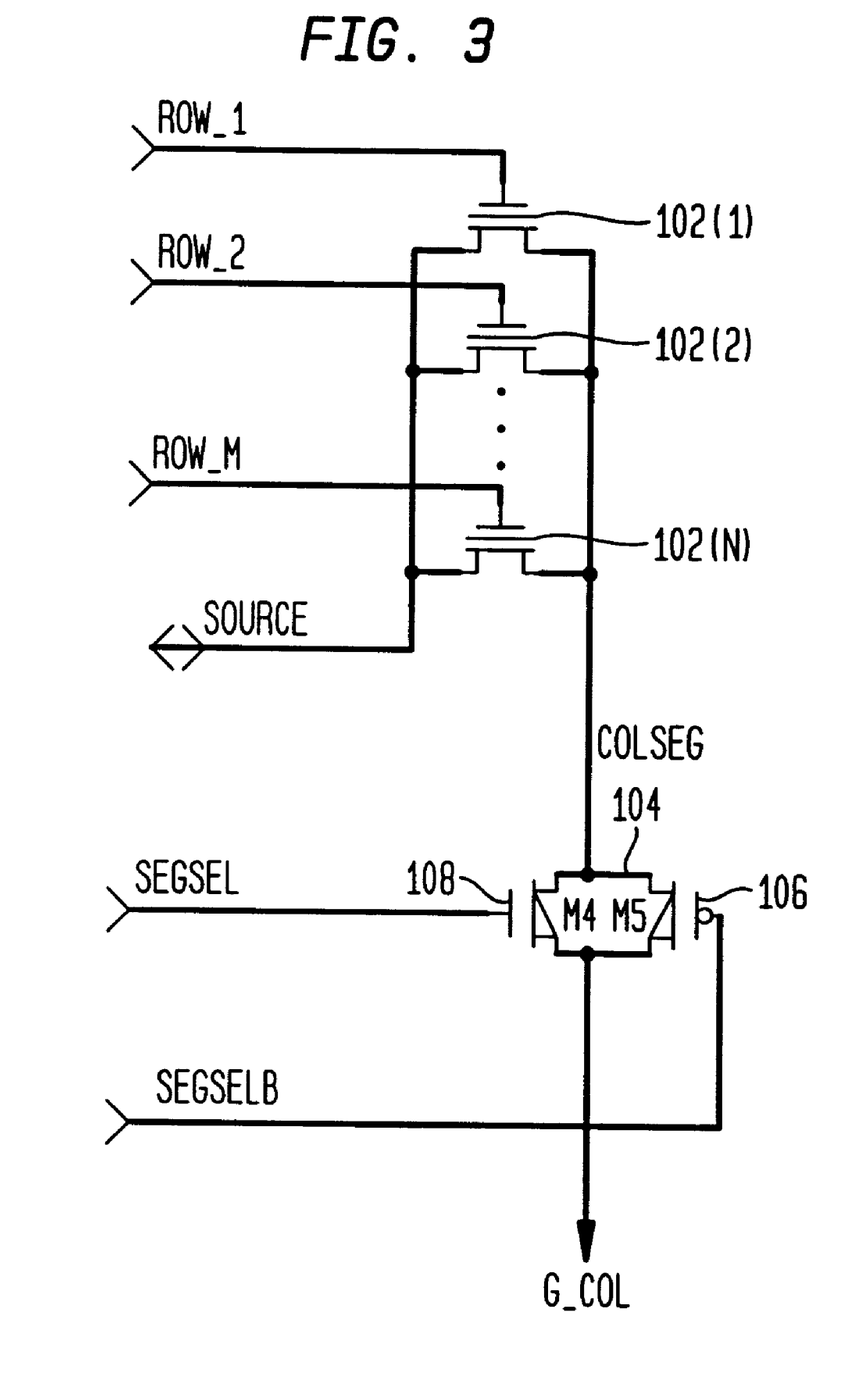
FIG. 3 is a more detailed circuit diagram of an individual column segment of the circuit of FIG. 2.

In order to reduce the effective capacitance, it is known in the art to divide each column into smaller column segments that are individually precharged and discharged for reading. FIG. 2 is a circuit diagram of a flash EEPROM of the prior art with segmented columns. FIG. 3 is a more detailed diagram of an individual column segment of the circuit shown in FIG. 2. Sense amplifier block 130, column select block 140, column precharge transistor block 160 and write erase block 160 are essentially identical to blocks 30, 40, 50 and 60 respectively, in the circuit of FIG. 1.

For instance, if a global column, e.g., 120(1), comprises 256 cells, it may be divided into four column segments, i.e., COLSEG_1_1, COLSEG_2_1, ... COLSEG_4_1, each comprising 64 cells. In this manner, the effective capacitance during a read operation can be cut by a factor of 4. As shown in FIG. 3, each column segment comprises memory cells 102(1), 102(2), ... 102(N). As before, the control gates of the cells are individually coupled to the rows, the source terminals of the cells are all coupled together to a voltage source and the drains of the cells are all coupled to the column segment. The column segment is coupled to the global column through a column segment select switch 104. As can be seen in FIG. 2, each column segment is coupled to the global column through a switch such as switch 104. A segment select signal line 110 and its inverse are coupled to the corresponding transistors, respectively, of the column segment select switches 104.

Switch 104 comprises two complementary, high voltage, thick oxide, transistors 106 and 108. The transistors are high voltage transistors because they need to pass 7 volts with as much as a ¼ milliamp of current to the column during write operations. Two complementary transistors are desirable because, as is known in the art, n-channel transistors pull down well, but do not pull up well, whereas p-channel transistors pull up well, but do not pull down well. The column segment select switch 104 has an n-channel device to most effectively pull the sense amplifier input towards ground for reading (when the accessed cell stores a 0) and has a p-channel device for the high voltage memory operations (erase and program) to most effectively pull the column up to the high voltage level needed on the drain terminal of the cell for programming (i.e., writing) or erasing cells.

The segmented column array architecture is well suited for fast, low power, read operations because only one column segment per column is precharged and discharged during a read cycle. Because the capacitance of a column segment has only a fraction of the capacitance of the global column, the precharge/discharge time and power also are reduced to only a fraction of what would have been needed to precharge/discharge the global column.

However, the improvement in performance is diminished somewhat because high voltage transistors such as transistors 106 and 108 of switch 104 have relatively high parasitic capacitance as well as low gain. Accordingly, switch 104 adds undesirable parasitic capacitance to the column segment and reduce read operation speed because of its low gain in the sensing and column precharge paths.

Further, the high voltage, low gain, transistors in the column precharge block 50 and write/erase data transfer gate block 60 remain in the circuit, with their inherent drawbacks.

SUMMARY OF THE INVENTION

The present invention relates to a new method and associated circuitry for applying the high column voltage needed to erase and program (write) a memory, particularly a segmented column flash EEPROM memory. In contrast to the low gain, thick oxide, high voltage, transistors used in the read column precharge path, data path and column segment select switches of the prior art, the present invention utilizes low voltage transistors.

In accordance with the invention, the high voltages necessary for high voltage memory operations in a flash EEPROM memory are provided through a high voltage path that is separate from the data and column segment precharge paths, whereby the transistors in the data sensing path and column precharge path and column segment select switch can be reduced both in number and in voltage/current rating.

DETAILED DESCRIPTION OF THE PREFERRED EMBODIMENT

Figure 4:
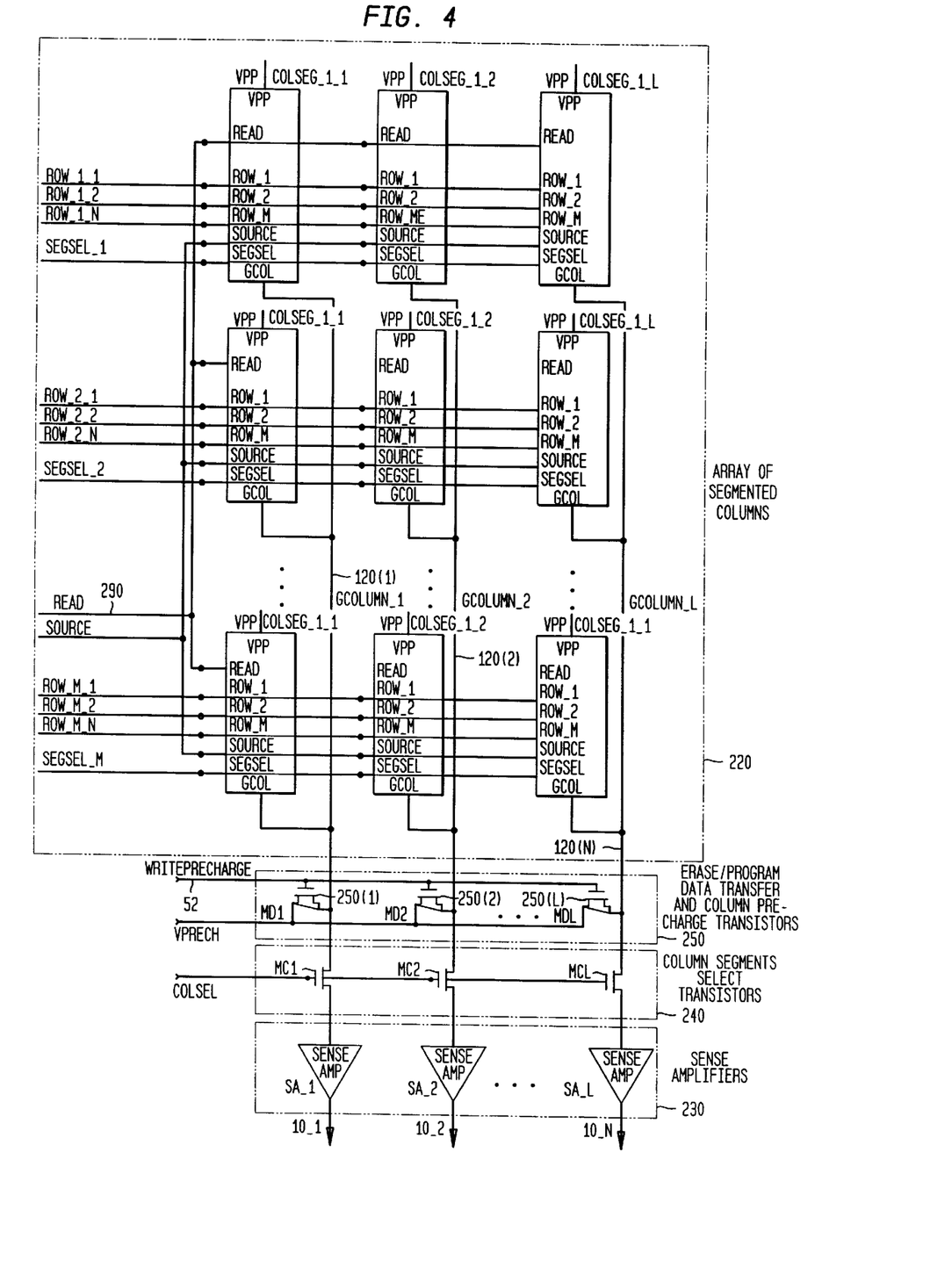
FIG. 4 is a circuit diagram of a segmented column flash EEPROM in accordance with the present invention.
Figure 5:
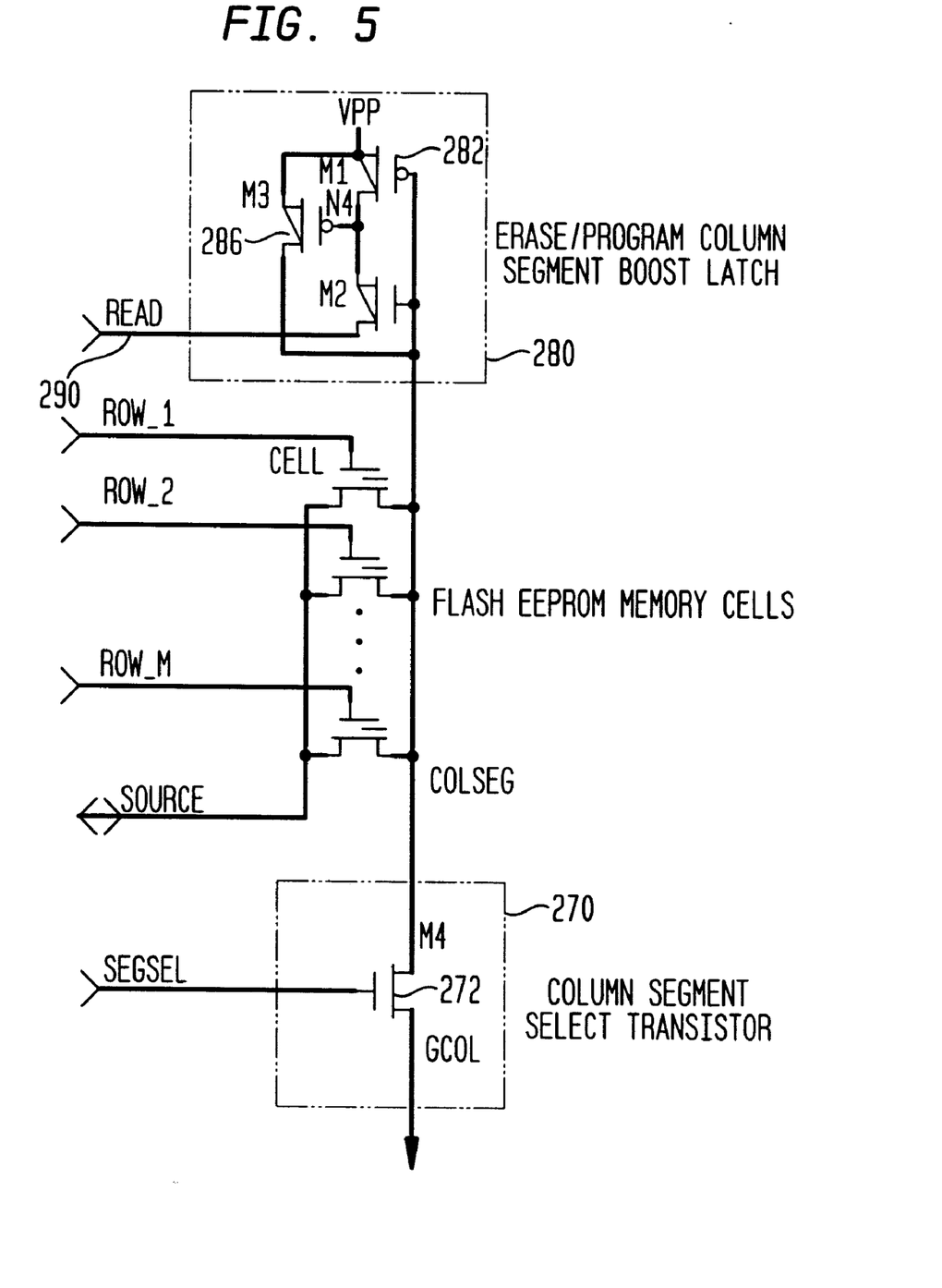
FIG. 5 is circuit diagram of a column segment of a segmented column flash EEPROM in accordance with the present invention.

FIG. 4 is a circuit diagram of a flash EEPROM in accordance with the present invention in which the individual column segments thereof are comprised of the circuit shown in FIG. 5. As shown in FIG. 4, a preferred embodiment of a flash EEPROM 200 in accordance with the present invention includes a memory array 220 comprising global columns, GCOLUMN_1, GCOLUMN_2, . . . GCOLUMN_L. Each column comprises M column segments. For instance, GCOLUMN_1 includes column segments COLSEG_1_1, COLSEG_2_1, . . . COLSEG_M_1). Each column segment comprises N rows. For instance, COLSEG_1_1 comprises ROW_1_1, ROW_1_2, . . . ROW_1_N. Accordingly, there are M×N rows per column and L columns. Therefore, there are a total M×N×L memory cells in this exemplary array. Flash EEPROM 200 further comprises an on-pitch sense amplifier block 230, and a column select transistor block 240. The on-pitch sense amplifier block 230 and column select transistor block 240 are conventional and do not, in and of themselves, constitute novel subject matter. A precharge/write data transfer block 250 combines the precharge transistor function and the write/erase data transistor function using low voltage CMOS transistors 250(1), 250(2) . . . 250(L) in accordance with the invention as described in detail further below. Each column segment is coupled to the global column as shown at terminal GCOL and is further coupled to a high voltage source VPP. Also, each column segment receives a segment select signal (SEGSEL_1, SEGSEL_2, . . . SEGSEL_M) which, when asserted, selects the corresponding column segment of all the global columns. Thus, for instance, SEGSEL_1 selects COLSEG_1_1,COLSEG_1_2, . . . COLSEG_1_M.

FIG. 5 shows exemplary column segment COLSEG_1_1 in greater detail. Preferably, all column segments are essentially identical. As shown in FIG. 5, each memory cell comprises a split gate memory cell transistor. However, it should be understood that this is merely a preferred embodiment and that the invention is applicable to memories comprising stacked gate memory cells and other types of electronically programmable memory cells. As in the prior art, the drain terminals of all of the cells are coupled to the column segment, the gate terminals are coupled to the rows and the source terminals are all coupled together to a source node. The segment select signals COLSEG_1_1 are coupled to a column segment select transistor.

Each column segment comprises an erase/program column segment boost latch 280. Erase/program column segment boost latch 280 couples the column to voltage source VPP and is the path through which the high voltage necessary for erasing and/or writing (i.e., programming) the memory cells (typically 7 volts) is provided to the column segment. Erase/program column segment boost latch 280 comprises a p-channel high voltage, thick oxide, transistor 282 coupled in series with an n-channel high voltage, thick oxide, transistor 284. The gates of those two transistors are coupled to the column segment. The source of transistor 282 is coupled to the high voltage source VPP (e.g., 7 volts). The drain of transistor 284 is coupled to the memory array's read control line 290. A third transistor 286, this one another p-channel, high voltage, thick oxide, transistor, has its gate coupled to the junction between transistors 282 and 284. Its source terminal is coupled to VPP and its drain terminal is coupled to the column segment.

A column segment select switch 270 comprises a single, low voltage, n-channel, transistor 272 with its gate terminal coupled to the corresponding SEGSEL signal line.

As discussed above in the Background section, in the operation of programming a flash memory, the memory array is first erased to clear all values stored therein. Typically, an erased cell presents itself as a logic low level (ground). Accordingly, writing or (programming) the memory typically means leaving in the erase state those cells which are to store a logic 0 and "writing" only those cells which are to store a logic 1 value. It should be understood by those of skill in the art that the values logic 0 and logic 1 are arbitrary and that they are simply two different voltages. In this specification, as well as in many, if not most actual memory devices, a logic 0 is represented by ground or 0 volts, and logic 1 is represented by a higher voltage, e.g., 3.3 volts.

As noted above, erasing a cell comprises placing a high enough voltage across its gate-to-drain path to cause electron tunneling from the drain to the floating gate so as to set the floating gate's nominal voltage to a particular value. That value is selected such that, when nominal high voltage (e.g. 3.3 volts) is applied to the fixed gate of the transistor (through the corresponding row terminal) for reading it, the floating gate goes above the transistor threshold voltage Vt so that the transistor turns on and the cell conducts the column segment to ground. Writing a cell involves applying high voltages to both the drain and fixed gate terminals of the cell so as to cause hot electron injection from the current path to the floating gate. Enough electron injection is allowed to occur to lower the nominal potential of the floating gate to a value such that, when the row corresponding to that cell is asserted for reading (i.e., when the fixed gate is raised to 3.3 volts), the floating gate remains below the threshold potential such that the cell does not turn on and does not conduct the column segment to ground. Accordingly, the precharge voltage placed on the column segment remains there and the sense amplifier reads the cell as containing a logic 1.

The operations of erasing and writing to memory cells of a memory device in accordance with the present invention will now be described in connection with the exemplary embodiment of the invention illustrated in FIGS. 4 and 5 and particularly column segment COLSEG__1__1. To raise a column segment to VPP (7 volts) during a write or erase operation, the high voltage power supply terminal VPP is initially set equal to the low voltage power supply terminal voltage VDD (e.g., 3.3 volts). Also, (1) read control input 290 is set to ground potential, (2) data equal in voltage to VDD is applied to the data input DATA__1, (3) the WRITE-PRECHARGE input 152 is raised to VDD, and (4) SEGSEL__1 is asserted to turn on the column segment select transistor 272 (FIG. 5). This sets the voltage on the column segment to VDD-Vt, where Vt is the n-channel threshold voltage of devices 250(1). A typical value of Vt is one volt. Thus, the column will be "raised" to a value of two volts (i.e., 3 volts minus 1 volt equals 2 volts). Within latch 280, transistors 282 and 284 form an inverter that controls whether transistor 286 is on or off. Although both inverter transistors 282 and 284 may be conductive, the gain of transistor 284 is much greater than that of transistor 282 (typically five times greater). Thus, with two volts on the column segment and VPP set at 3 volts, the junction 288 of the inverter is near ground, turning on pass transistor 286. The conduction of transistor 286 pulls the column up to VPP from the interim column voltage of 2 volts, because, when the gate of transistor 286 is lowered from its drain potential VPP to less than one threshold below its drain potential (VPP-$V_{tp}$), it conducts, thus raising its source (the column) to its drain potential (VPP). This turns transistor 282 completely off and settles the junction 288 at ground potential. At this point, VPP is raised from VDD to the high voltage level, 7 volts, required for the write or erase operation. This high voltage is passed through transistor 286 to the column and the write or erase occurs depending on the voltage applied to the cell's gate terminal (i.e., depending on the corresponding row input).

At the end of the write or erase operation, it is necessary to return the column to ground potential. This is accomplished by first lowering VPP back down to VDD, thus also lowering the column to VDD. Next, the read control input 290 is raised to VDD level, raising node 288 to an n-channel threshold below VPP. This reduces, but typically not entirely blocks, the conduction of transistor 286. With transistor 286 only weakly conductive, data input DATA__1 is lowered to ground, which discharges the column completely to ground and raises node 288 to VPP (which is now equal to VDD), completely turning off transistor 286. It can be seen that transistor 250(1) must overcome any residual conduction of transistor 286. This is not difficult because transistor 286 is biased in a low gain state due to the gate-to-source voltage on transistor 286 being only slightly above its threshold voltage.

As previously mentioned, to inhibit writing or erasing certain columns, it is necessary to keep those columns at ground while writing or erasing cells on other columns along the active row. To do this, exactly the same procedure is followed as described above when raising a column to high voltage, except that the data inputs corresponding to the columns not to be written are kept at ground potential during the write or erase operation. This holds these columns at ground potential, preventing them from being raised to VDD-Vt. Consequently, junction 288 of the latch 280 is keep at VPP, thus blocking conduction through transistor 286.

During the write and erase operations described above, the VPP supply terminal is first raised from the lower VDD level to the higher voltage VPP and then, at the termination of write or erase, lowered back to the level of VDD. If VPP is supplied from an off-chip supply, this is accomplished by changing the off-chip voltage supply to the higher voltage VPP. Alternately, VPP can be switched on-chip from VDD to an externally supplied or internally charge pumped high voltage supply. These methods are well known to those skilled in the art.

While not the preferred embodiment, it is also possible to write and erase while keeping VPP fixed at a high voltage at all times. The same procedure described above is followed except that VPP is fixed at the higher voltage level, e.g., 7 volts. This is not the preferred mode of operation for two reasons. First, after the column has been raised to VDD-Vt, it will be more difficult for the latch inverter (transistors 282 and 284, to lower the output at node 288 because the p-channel transistor 284 is more conductive due to a larger gate-to-source voltage. To overcome this, the gain difference between transistors 282 and 284 is increased, as previously discussed, so that transistor 284 has a much higher gain than transistor 282. Second, during write or erase termination, the column will be lowered from high voltage to ground, instead of from VDD to ground, by transistor 250(1). At this time, DATA__1 is at ground and the drain-to-source potential across transistor 250(1) is the high voltage potential. To prevent punchthrough and degraded reliability of transistor 250(1), its channel length must be increased. This reduces the gain of transistor 250(1) which, in turn, has the undesirable effect of increasing precharge and cycle time. However, designers may find this embodiment useful for certain applications.

Since the high voltage for high voltage memory operations now enters the column through the erase/program column segment boost latch 280, the data path transistors do not need to pass high voltages across their gate-to-source or gate-to-drain terminals and can therefore be low voltage devices. Likewise, the precharge transistors may be low voltage devices. This is possible because, when high voltage is on the column, the gates of the column precharge transistors are at VDD levels, not at ground as in the prior art. Thus, the oxide stress (drain- and source-to-gate potential) is reduced to the difference between the high voltage level and VDD (e.g., 7 volts−3 volts=4 volts). The use of low voltage transistors reduces the precharge and cycle times and eliminates their lengthening over time by high voltage transistor degradation. In fact, the data path transistor and the precharge transistor of the prior art for each column can be combined into a single, n-channel, low voltage, transistor 250(1), 250(2), . . . 250(N), as shown in FIG. 4.

Further, the column segment select switch may be a single low voltage transistor 272, rather than two complementary, high voltage, transistors, since it no longer needs to support high gate-to-drain or gate-to-source voltages. As previously mentioned, during high voltage memory operations, the column segment select transistor 272 is turned on such that a low voltage is transferred to the column segment from the global column through the column segment select transistor 272. This low voltage activates the erase/program column boost latch 280 to conduct the voltage from the high voltage source VPP onto the column segment for high voltage memory operations. The column segment select transistor can be a low voltage transistor because, when the high voltage is coupled onto the column segment through the column segment boost latch 280, the gate of the column segment select transistor 272 is at nominal VDD voltage (e.g., 3.3 volts). As long as the difference between the gate and drain terminal voltages does not exceed the voltage rating of the column segment select transistor and the column segment select transistor channel length is long enough to support the high voltage drain to source potential, the column select transistor will not be damaged.

The low voltage column segment select transistors 272 have higher gain and smaller parasitic capacitive column loading than the high voltage column segment select transistors of the prior art. The result is reduced column precharge time. Since the transistors have higher gain, read access time is reduced. Even further, the elimination of the large, high voltage, p-channel, transistor in the column segment select switch further significantly reduces the global column capacitance, resulting in further reduction in read access and column precharge times.

Furthermore, the write/erase data inputs, DATA_1, DATA_2, . . . DATA_L, and read control signal 290 are at a VDD level when asserted. Thus, the circuitry that generates these signals does not require high voltage transistors, thus leading to even greater chip reliability and lower column segment parasitic capacitance.

The elimination of all high voltage, unreliable, and potentially unstable devices from the timing critical data sensing and column precharge paths increases the reliability of the memory array.

While there has been described herein the principles of the invention, it is to be understood by those skilled in the art that this description is made only by way of example and not as a limitation to the scope of the invention. For example, while the preferred embodiment shown in FIG. 5 illustrates a single transistor per column for use as both the write/erase transistor and the column precharge transistor, it is considered to be within the scope of the present invention to use two separate low voltage transistors to separate these functions. Also, it is possible to utilize the column segment latch and related path for applying high voltage to the column segments only for programming or only for erasing, while providing a different path for the other function. In other words, while it is clearly advantageous in most cases to use the column segment boost latch for both erasing and program operations, it certainly is possible to use it for only one of those functions. It is intended by the appended claims to cover all modifications of the invention which fall within the true spirit and scope of the invention.

I claim:

1. An integrated circuit having a segmented column electronically programmable memory comprising:
   a plurality of memory cells arranged in rows and columns, each of said columns being segmented into smaller column segments coupled to a global column;
   a column segment select transistor corresponding to each said column segment coupled between said column segment and a global column of said memory; and
   a column segment latch corresponding to each said column segment for coupling between a high voltage source and said column segment, through which a high voltage is applied to said column segment for high voltage memory operations relating to said memory cells.

2. An integrated circuit as set forth in claim 1 wherein said column segment select transistor is a low voltage transistor.

3. An integrated circuit as set forth in claim 2 wherein said program column segment latch comprises:
   a first high voltage transistor having its current flow terminals coupled between said high voltage source and said column segment; and
   a control transistor coupled to control said first high voltage transistor to conduct during high voltage memory operations.

4. An integrated circuit as set forth in claim 3 wherein said control transistor comp rises an inverter.

5. An integrated circuit as set forth in claim 3 wherein said control transistor comprises second and third high voltage transistors coupled as an inverter for controlling said first high voltage transistor.

6. An integrated circuit as set forth in claim 5 wherein said second high voltage transistor has a first current flow terminal coupled to said high voltage source, a control terminal coupled to said column segment and a second current flow terminal coupled to a control terminal of said first high voltage transistor and said third high voltage transistor has a first current flow terminal coupled to said control terminal of said first high voltage transistor, a control terminal coupled to said column segment and a second current flow terminal coupled to a signal indicative of whether the memory is in a high voltage memory operation mode.

7. An integrated circuit as set forth in claim 6 wherein said first high voltage transistor is a p-channel transistor, said second high voltage transistor is a p-channel transistor and said third high voltage transistor is an n-channel transistor.

8. An integrated circuit as set forth in claim 2 wherein said low voltage column segment select transistor comprises a single transistor.

9. An integrated circuit as set forth in claim 8 wherein said low voltage column segment select transistor comprises an n-channel transistor.

10. An integrated circuit as set forth in claim 5 wherein said low voltage column segment select transistor comprises a single transistor.

11. An integrated circuit as set forth in claim 10 wherein said low voltage column segment select transistor comprises an n-channel transistor.

12. An integrated circuit as set forth in claim 3 wherein said memory is an EEPROM.

13. An integrated circuit as set forth in claim 12 wherein said EEPROM is a flash EEPROM.

14. An integrated circuit having a segmented column electronically programmable memory comprising:
   a plurality of memory cells arranged in rows and columns, each of said columns being segmented into smaller column segments coupled to a global column;
   a column segment latch corresponding to each said column segment for coupling between a high voltage source and said column segment, through which a high voltage may be applied to said column segment for high voltage memory operations relating to said memory cells; and
   a low voltage pre-charge and erasing/programming transistor coupled to each of said global columns.

15. An integrated circuit having a segmented column electronically programmable memory as set forth in claim 14 wherein said low voltage precharge and erasing/programming transistor comprises a single transistor that is used for both precharging said column for read operations and for writing data to a memory cell in said column during programming.

16. An integrated circuit having a segmented column electronically programmable memory as set forth in claim 14 further comprising:
   a low voltage column segment select transistor coupled between each of said column segments and a corresponding global column.

17. An integrated circuit having a segmented column electronically programmable memory as set forth in claim 16 wherein said column segment select transistor comprises a single transistor.

18. An integrated circuit having a segmented column electronically programmable memory as set forth in claim 17 wherein said column segment select transistor comprises an n-channel transistor.

19. An integrated circuit having a segmented column electronically programmable memory as set forth in claim 16 wherein said memory is an EEPROM.

20. An integrated circuit having a segmented column electronically programmable memory as set forth in claim 19 wherein said EEPROM is a flash EEPROM.

21. An integrated circuit having a segmented column electronically programmable memory as set forth in claim 14 wherein said column segment latches comprise:
 first and second latch transistors coupled to form an inverter having an output, said second transistor having a gain greater than a gain of said first transistor; and
 a third latch transistor coupled to form a pass transistor, said third latch transistor having a gate coupled to the output of said inverter, a source coupled to a power supply, and a drain coupled to a column of said memory array.

22. An integrated circuit having a segmented column memory as set forth in claim 21 wherein the voltage applied to said column segments through said column segment latches is controlled as a function of an initial voltage on said column segment.

23. A method of providing high voltage for high voltage memory operations of a segmented column electronically programmable memory device to a column segment of said memory device, said memory device comprising a plurality of memory cells arranged in rows and columns with said columns segmented into said column segments, a read precharge path for coupling a precharge voltage onto said column segment and a data path for writing data to said memory cells, said method comprising the steps of:
 applying a high voltage to a latch coupled to said column segment, said latch being outside of said read precharge path and said data path; and
 applying a low voltage to said column segment to turn said latch on such that said high voltage is coupled onto said column segment.

24. A method as set forth in claim 23 wherein said read precharge path and said data path to said column segment are combined and wherein said step of applying a low voltage comprises applying said low voltage to said column segment through said combined path.

25. A method as set forth in claim 24 wherein said memory device further comprises a column segment select transistor coupled between said column segment and said combined path and wherein said step of applying said low voltage comprises applying said low voltage to said column segment through said combined path and said column segment select transistor.

26. A method of conducting high voltage memory operations in a segmented column electronically programmable memory device, said memory device comprising a plurality of memory cells arranged in rows and columns with said columns segmented into column segments, a read precharge path for coupling a precharge voltage onto said column segment, a data path for writing data to said memory cells, a high voltage path outside of said read precharge path and said data path for coupling a high voltage onto said column segment for high voltage memory operations relating to said memory cells, said high voltage path comprising a latch, and a read control line coupled to said latch and indicative of whether the memory device is in a read mode or a high voltage memory operation mode, said method comprising the steps of:

(1) supplying a high voltage source to said latch;
 (2) setting said read control line to indicate high voltage memory operation mode;
 (3) applying a nominal voltage to said column through said read precharge path or said data path; and
 (4) applying an appropriate voltage to a memory cell on said column segment to set its memory value to a desired value.

27. A method as set forth in claim 26 wherein said read precharge path and said data path are the same path and comprise a transistor having a control terminal coupled to a write-precharge signal which is raised to nominal voltage for precharging and writing, a first current flow terminal coupled to said data path and a second current flow terminal coupled to said column segment and step (3) comprises the steps of:
 (3.1) applying a nominal voltage to said control terminal of said transistor; and
 (3.2) applying a nominal voltage to said first current flow terminal of said transistor.

28. A method as set forth in claim 27 wherein step (1) comprises the steps of:
 (1.1) first applying a nominal voltage to said latch prior to step; and
 (1.2) raising said nominal voltage to a high voltage between steps (3) and (4).

29. A method as set forth in claim 28 wherein step (2) comprises setting said read control line to a nominal voltage.

30. A method as set forth in claim 29 wherein said nominal voltage is about 5 volts.

31. A method as set forth in claim 29 wherein said nominal voltage is about 3 volts.

32. A method as set forth in claim 31 wherein said nominal voltage is 3.3 volts.

33. A method as set forth in claim 29 wherein said high voltage is about 7 volts.

34. A method as set forth in claim 28 further comprising the step of:
 (5) returning the voltage on said column segment to ground.

35. A method as set forth in claim 34 wherein step (5) comprises the steps of:
 (5.1) applying a voltage to said read control line to indicate read mode; and
 (5.2) applying a ground voltage to said column through said read precharge path or said data path.

36. A method as set forth in claim 35 wherein step (5.1) comprises applying a nominal voltage to said read control line.

37. A method as set forth in claim 30 further comprising the step of:
 (5) returning the voltage on said column segment to ground.

38. A method as set forth in claim 37 wherein step (z5) comprises the steps of:
 (5.1) applying a voltage to said read control line to indicate read mode; and
 (5.2) applying a ground voltage to said column through said read precharge path or said data path.

39. A method as set forth in claim 38 wherein step (5.1) comprises applying a nominal voltage to said read control line.

* * * * *